United States Patent [19]

Iwasaki

[11] Patent Number: 6,146,083
[45] Date of Patent: Nov. 14, 2000

[54] SUBSTRATE TRANSFERRING APPARATUS AND SUBSTRATE PROCESSING APPARATUS USING THE SAME

[75] Inventor: Tatsuya Iwasaki, Kumamoto, Japan

[73] Assignee: Tokyo Electron Limited, Tokyo, Japan

[21] Appl. No.: 09/108,195

[22] Filed: Jul. 1, 1998

[30] Foreign Application Priority Data

Jul. 4, 1997 [JP] Japan ................................ 9-193379

[51] Int. Cl.[7] ............................ B25J 15/10; B65G 49/07
[52] U.S. Cl. ........................... 414/744.3; 414/941; 901/39
[58] Field of Search ............................ 414/744.3, 744.5, 414/941; 901/39; 294/1.1, 64.1, 103.1; 454/67

[56] References Cited

U.S. PATENT DOCUMENTS 5,054,988  10/1991  Shiraiwa ............................ 414/941 X
5,061,144  10/1991  Akimoto et al. ........................ 414/225
5,374,147  12/1994  Hiroki et al. ........................ 414/936 X
5,700,046  12/1997  Van Doren et al. ................ 414/941 X
5,706,930   1/1998  Sahoda et al. ....................... 414/217 X

FOREIGN PATENT DOCUMENTS 7-263520  10/1995  Japan.
8-293534  11/1996  Japan.

Primary Examiner—F. J. Bartuska
Attorney, Agent, or Firm—Oblon, Spivak, McClelland, Maier & Neustadt, P.C.

[57] ABSTRACT

A substrate transferring apparatus comprising support members for supporting a substrate, and a drive mechanism for moving the support members to transfer the substrate, wherein the support members each have a pair of outer support segments for supporting an outer periphery of the substrate and a pair of inner support segment provided between the outer support segments.

16 Claims, 7 Drawing Sheets

SUBSTRATE TRANSFERRING APPARATUS AND SUBSTRATE PROCESSING APPARATUS USING THE SAME

BACKGROUND OF THE INVENTION

The present invention relates to a substrate transferring apparatus for transferring a large-sized substrate such as an LCD substrate and to a substrate processing apparatus using the substrate transferring apparatus.

In the manufacture of liquid crystal displays (LCD), the LCD substrate, made of glass, is coated with photo resist liquid to form a resist film, and the resist film is exposed to correspond to a circuit pattern. This is referred to as developing process, that is, the circuit pattern is formed by the so-called lithography technique.

Conventionally, such a series of coating/developing processes is carried out by a system in which the respective processing apparatus for carrying out these processes are incorporated. In such a system, there is provided a transferring apparatus for transferring/receiving a substrate between the respective processing units for performing the respective processes such as a cleaning process, a coating process, a developing process, and a heating process.

Such a transferring apparatus is provided to be movable on a transferring path. Also, the transferring apparatus comprises a base member, which can be rotated and moved up and down in transferring/receiving the substrate to/from the processing unit, and a base support arm, which is movable back and forth to the base member so as to deliver the substrate.

Conventionally, there is used the substrate transferring machine having a structure in which a pair of support sections supports an outer peripheral part of the substrate, and a guide provided at each of the tip of the peripheral part and a base part holds the substrate.

On the other hand, in this type of transferring machine, a belt driving system is generally used as a driving mechanism for moving the support arm back and fourth. In the use of the belt driving system, however, particles are easily generated. If such particles adhere to the processing substrate, problems such as deterioration of device performance and reduction of yield are caused. In order to solve such problems, in Japanese Patent KOKAI Publication No. Hei 8-293535, there are provided a cover for covering the driving mechanism of the support arm and means for sucking in the cover.

By the way, the need for enlarging the size of the LCD substrate has recently been increased more and more. Specifically, there has been needed the size of the substrate, which is greatly enlarged to, for example, 830×650 mm from the conventional size of 650×550 mm. If the size of the substrate is greatly increased, deflection of the central portion thereof is increased sharply as compared with the conventional case in supporting the substrate by the support arm. Then, at the time of transferring and receiving the substrate, the strokes of the up and down motion must be increased with the sharp increase in deformation of the central portion. As a result, throughput is reduced, and a transfer error is easily caused.

Moreover, if the substrate is enlarged as mentioned above, a large-sized driving mechanism of the transferring apparatus is also needed and an amount of generating particles is increased. However, in the technique disclosed in the above-mentioned Japanese Patent Application KOKAI Publication Hei 8-293535, an absorbing path, that is, an exhausting path is provided at an end portion side of the base member. As a result, there is possibility that particles generated from the driving mechanism will be not always absorbed effectively when the substrate is enlarged.

BRIEF SUMMARY OF THE INVENTION

An object of the present invention is to provide a substrate transferring apparatus in which disadvantages caused by deflection of a substrate on support members.

Another object of the present invention is to provide a substrate transferring apparatus, which can remove particles generated from the driving mechanism effectively.

Further another object of the present invention is to provide a processing apparatus using such substrate apparatus.

According to a first aspect of the present invention, there is provided A substrate transferring apparatus comprising support members for supporting a substrate, and a drive mechanism for moving the support members to transfer the substrate, wherein the support members each have a pair of outer support segments for supporting an outer periphery of the substrate and at least one inner support segment provided between the outer support segments.

According to a second aspect of the present invention, there is provided a substrate transferring apparatus for transferring a substrate while being moving on a transferring path, comprising support members for supporting the substrate, a base member for supporting the support members movably, a driving mechanism, provided in the base member, for moving the support members, a main body supporting the base member, and moving on the transferring path, an exhausting path extending downward through the main body from a portion close to the driving mechanism, and an exhausting unit for exhausting an interior of the base member through the exhausting path.

According to a third aspect of the present invention, there is provided a substrate processing apparatus for subjecting a predetermined process to a substrate, comprising a processing section for providing the predetermined process to the substrate, and a transferring machine comprising support members for supporting the substrate, and a drive unit for moving the support members to transfer the substrate, the support members having a pair of outer support segments for supporting an outer periphery of the substrate and at least one inner support segment provided between the outer support segments.

According to a fourth aspect of the present invention, there is provided a substrate processing apparatus for subjecting a predetermined process to a substrate, comprising a processing section for providing the predetermined process to the substrate, and a substrate transferring machine for transferring the substrate while being moving on a transferring path in the processing section, the substrate transferring machine comprising support members for supporting the substrate, a base member for supporting the support members movably, a driving mechanism, provided in the base member, for moving the support members, a main body supporting the base member, and moving on the transferring path, an exhausting path for exhausting downward through the main body from a portion close to the driving mechanism, and an exhausting unit for exhausting an interior of the base member through the exhausting path.

According to the first and third aspects of the present invention, the support members have the pair of outer support segments for supporting an outer periphery of the substrate and at least one inner support segment provided between these outer support segments. As a result, even if the size of the substrate is large, its deflection can be reduced. Therefore, there are not caused the disadvantages such as the increase in the strokes of the up and down motion in transferring the substrate and the transfer error because of the deflection of the substrate.

According to the second and fourth aspects of the present invention, there is provided the exhausting path exhausting downward through the main body from the portion close to the driving mechanism of the base member, and the exhaust is performed through the exhausting path by exhausting means. As a result, high exhaust efficiency can be obtained, and particles caused by the driving mechanism can be effectively removed.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will now be specifically described with reference to the accompanying drawings.

Figure 1:
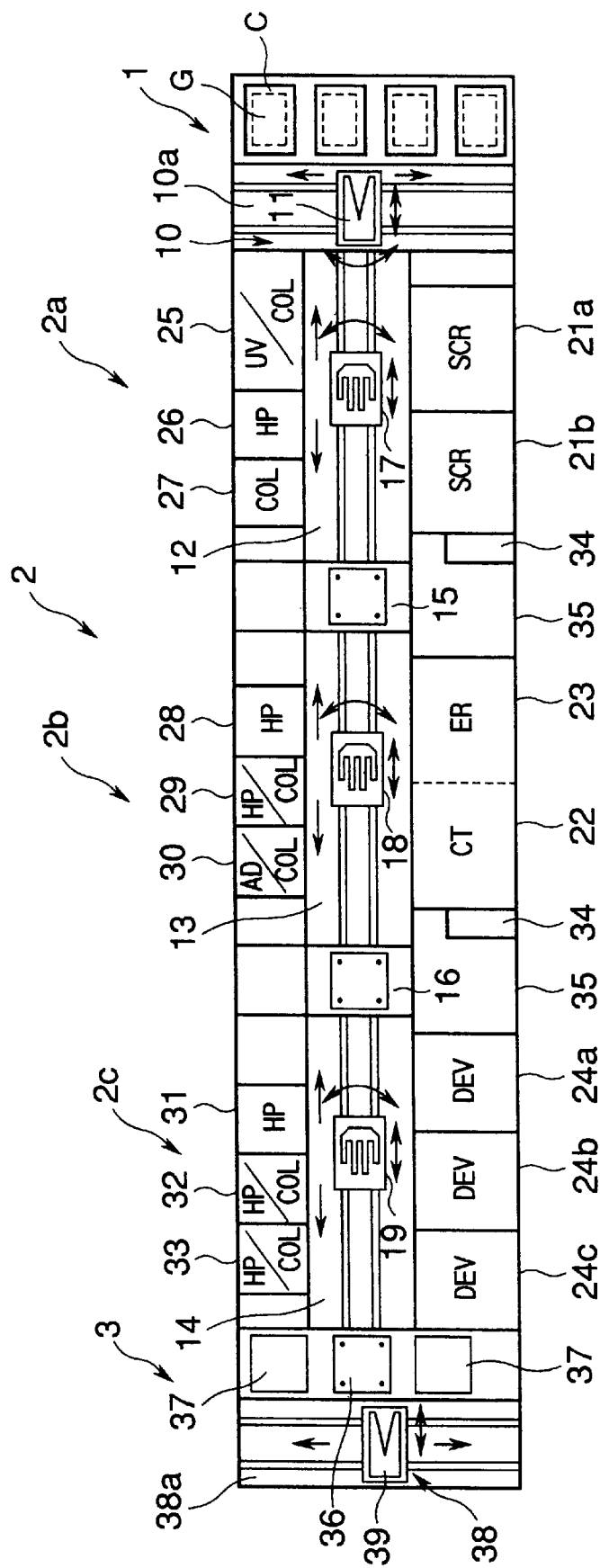
FIG. 1 is a perspective view showing a resist coating/developing system to which a substrate transferring apparatus of the present invention is applied.

FIG. 1 is a plan view showing an LCD substrate coating/developing process system to which the present invention is applied.

This coating/developing process system comprises a cassette station 1 in which a cassette C to incorporate a plurality of substrates G therein is loaded, a processing station 2 including a plurality of processing units which apply a series of processes including coating/developing of resist to the substrates G, and an interface station 3 for transferring the substrate G between the coating/developing process system and an exposure unit (not shown). The cassette station 1 and the interface station 3 are provided to both ends of the processing station 2 respectively.

The cassette station 1 comprises a transferring mechanism 10 for transferring an LCD substrate between the cassette C and the processing station 2. Loading/unloading the cassette C into/from the cassette station 1 is then carried out. In addition, the transferring mechanism 10 comprises transferring arms 11 which are movable on transferring paths 10a provided along an alignment direction of the cassettes, and the substrate G can be carried between the cassette C and the processing station 2 by virtue of the transferring arms 11.

The processing station 2 is divided into a front stage section 2a, an intermediate stage section 2b, and a rear stage section 2c, in which transferring paths 12, 13 and 14 are provided in their central areas respectively and processing units are arranged on both sides of these transferring paths respectively. A relay section 15 is provided between the front stage section 2a and the intermediate stage section 2b, and a relay section 16 between the intermediate stage section 2b and the rear stage section 2c.

The front stage section 2a comprises a main transferring machine 17 which is movable along the transferring path 12. Two cleaning units (SCR) 21a and 21b are provided to one end side of the transferring path 12, while a ultraviolet irradiating/cooling unit (UV/COL) 25 and a heating process unit (HP) 26 and a cooling unit (COL) 27, both being stacked as two upper and lower stages respectively, are provided to the other end side of the transferring path 12.

Then, the intermediate stage section 2b comprises a main transferring machine 18 which is movable along the transferring path 13. A resist coating process unit (CT) 22 and a peripheral resist removing unit (ER) 23 which can remove the resist on the peripheral part of the substrate G are provided integrally to one end side of the transferring path 13, whereas heating process units (HP) 28 which are stacked as two stages vertically, a heating/cooling process unit (HP/COL) 29, in which the heating process unit and the cooling process unit are stacked vertically, and an adhesion/cooling process unit (AD/COL) 30, in which an adhesion process unit and a cooling unit are stacked vertically, are provided to the other end side of the transferring path 13.

In addition, the rear stage section 2c comprises a main transferring machine 19 which is movable along the transferring path 14. Three developing process units 24a, 24b, and 24c are provided to one end side of the transferring path 14, while heating process units 26, which are stacked as two stages vertically, and two heating/cooling process units (HP/COL) 32 and 33, in which a heating process unit and a cooling process unit are vertically stacked respectively, are provided to the other end side of the transferring path 14.

The processing station 2 is so constructed that spinner system units such as a cleaning process unit 21a, a resist process unit 22a, a developing process unit 24a, etc. are arranged on one side of the transferring path, while only thermal system process units such as the heating process unit, the cooling process unit, etc. are arranged on the other side of the transferring path.

Chemical liquid supply units 34 and spaces 35 for loading and unloading of the main transferring machine are arranged at the spinner system units side of relay sections 15 and 16.

The interface station 3 comprises an extension 36 for holding the substrate temporarily when the substrate is transferred/received to/from the processing station 2, two buffer stages 37 which are provided on both sides of the extension 36 and in which buffer cassettes are arranged, and a transferring mechanism 38 for transferring the substrate G between the extension 36/two buffer stages 37 and an exposure unit (not shown). The transferring mechanism 38 includes a transferring arm 39 which is movable on transferring paths 38a provided along the alignment direction of the extension 36 and the buffer stages 37. The substrate G can be carried between the processing station 2 and the exposure unit by the transferring arm 39.

Like the above, space saving and improvement in the efficiency of the process can be achieved by incorporating respective process units together.

In the coating/developing process system as constructed above, the substrate G in the cassette C is carried into the processing station 2. Then, in the processing station 2, first the substrate G is subjected to surface modifying/cleaning process in the ultraviolet irradiating/cooling unit (UV/COL) 25 and then to scriber cleaning process in the cleaning units (SCR) 21a and 21b after the substrate has been cooled, then is dried by heating operation in the heating process unit (HP) 26, and then is cooled in the cooling unit (COL) 27.

After this, the substrate G is carried to the intermediate stage section 2b and then to an adhesion process (HMDS (Hexamethyldisilazane) process) in the upper stage adhesion process unit (AD) of the unit 30 in order to enhance a fixing property of the resist. Then, the substrate G is cooled in the cooling unit (COL) and then coated with the resist in the resist coating unit (CT) 22. Then, extra resist on the peripheral part of the substrate G is removed in the peripheral resist removing unit (ER) 23. Then, the subject G is subjected to pre-bake process in the heating process unit (HP) in the intermediate stage section 2b and then is cooled in the lower stage cooling unit (COL) in the unit 29 or 30.

Thereafter, the substrate G is carried by the main transferring machine 19 from the relay section 16 to the exposure unit via the interface station 3, and then predetermined patterns are exposed on the substrate G. Then, the substrate G is carried again via the interface station 3 and then is developed in any of the developing process units (DEV) 24a, 24b, and 24c to form predetermined patterns thereon. The developed substrate G is subjected to post-bake process in any of the heating process unit (HP), then is cooled in the cooling unit (COL), and then is put in the predetermined cassette on the cassette station 1 by virtue of the main transferring machines 19, 18, and 17 and the transferring mechanism 10.

Figure 2:
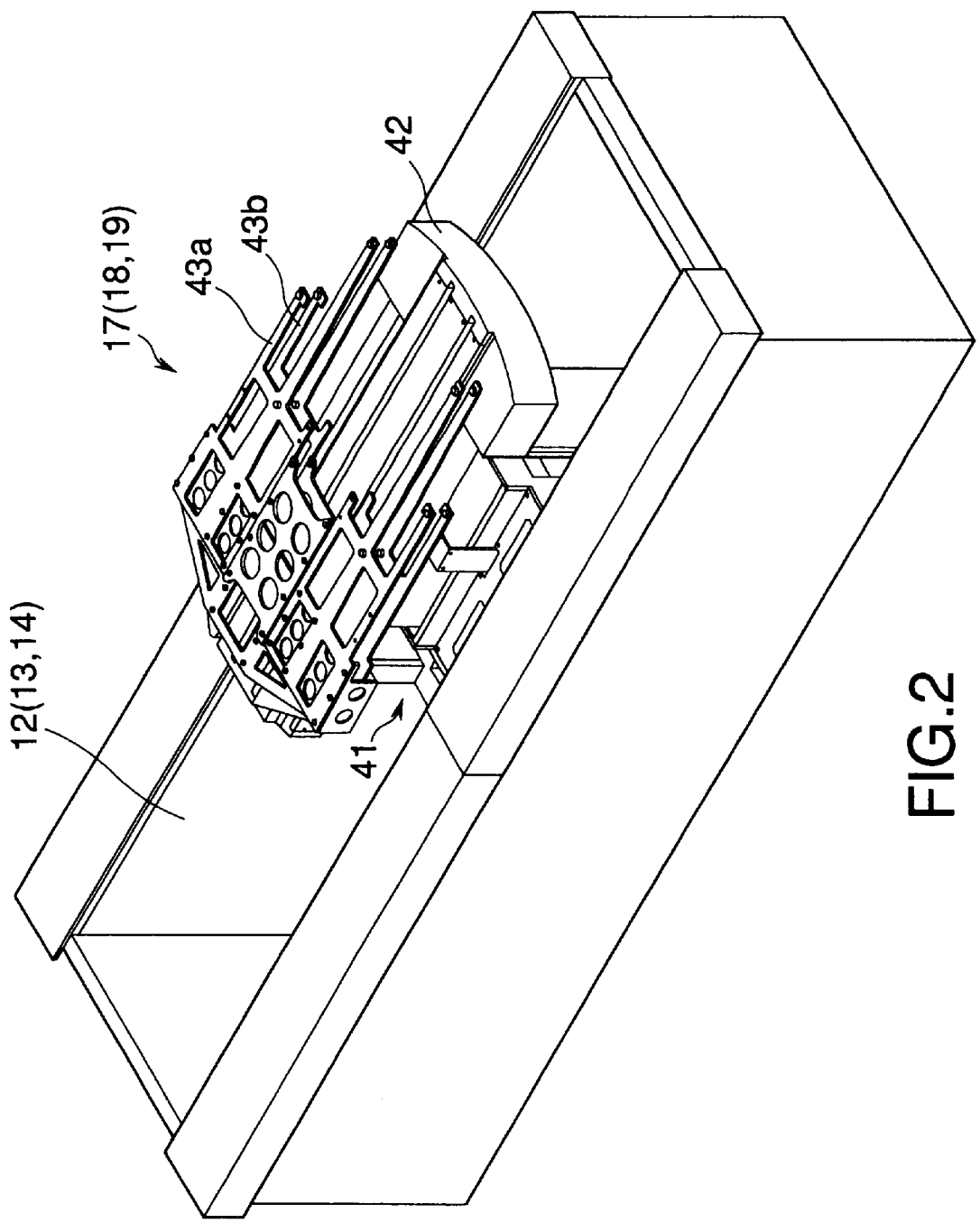
FIG. 2 is a perspective view showing a main transferring machine in the resist coating/developing system of FIG. 1.
Figure 3:
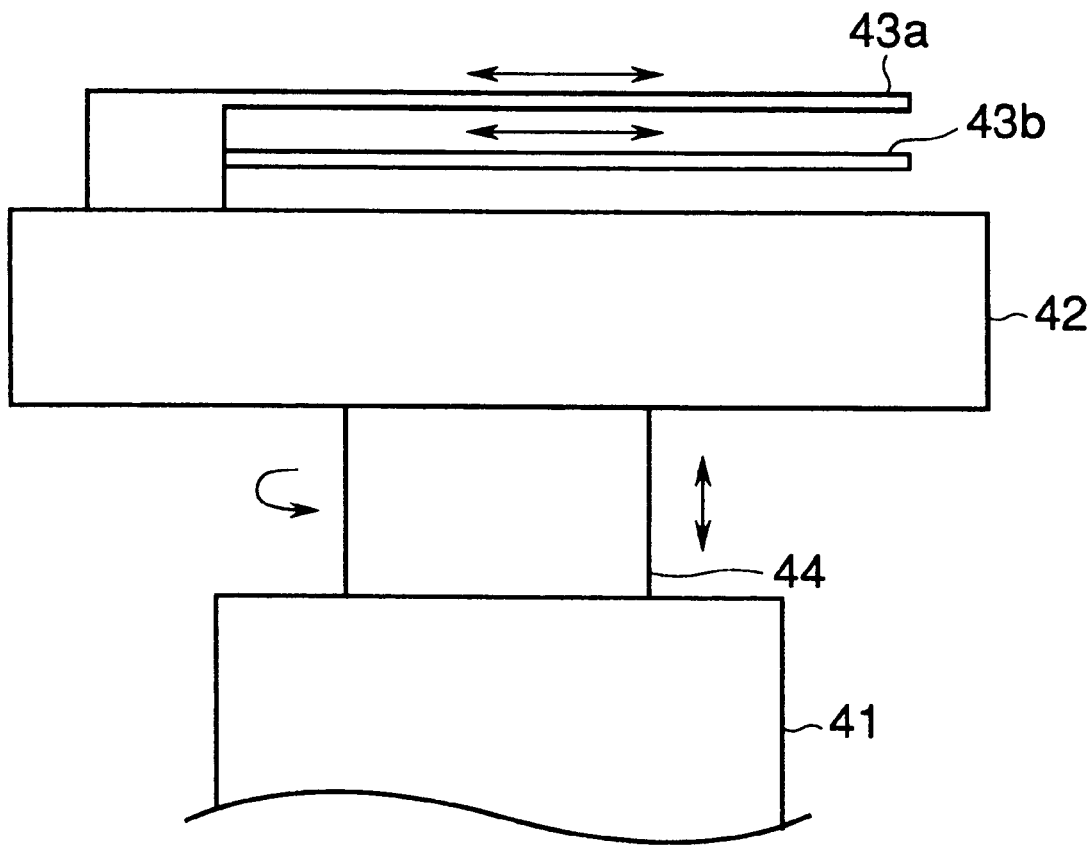
FIG. 3 is a schematic side view showing the main transferring machine in the resist coating/developing system of FIG. 1.

The following will explain the main transferring machine for transferring the substrate in performing a series of processes. FIG. 2 is a perspective view showing the schematic structure of the main transferring machine in the resist coating/developing system, and FIG. 3 is a schematic side view of FIG. 2.

As shown in these figures, the main transferring machine 17 comprises a main body 41, which is movable along a transfer path 12, a base member (base plate) 42, which can move up and down to the main body 41 and which can rotate thereto, and upper and lower substrate support members 43a and 43b, which can independently move on the base member 42 along a horizontal direction. Then, a central portion of the base member 42 and the main body 41 are coupled to each other by a coupling portion 44. The coupling portion 44 is moved up and down or rotated by a motor (not shown) built in the main body 41, thereby the base member 42 is moved up and down or rotated. The main transferring machines 18 and 19 are formed to have the same structured in the same manner as the case of the main transferring machine 17.

In the drive control of the vertical motion of the base member 42 and its rotation and that of the substrate support members 43a and 43b, an S-shape driving system is used to transfer a large-sized substrate with high throughput and high transfer stability. The S-shape driving system is a motor driving system for driving a motor so that the acceleration and deceleration are smoothly performed.

From a viewpoint of improvement in the throughput, a pass operation is used in which before one operation is completed, a next operation is started. Moreover, from a viewpoint of transfer stability, a multishaft synchronization method and an auto-acceleration method are used. The multishaft synchronization method controls the shafts so as to move, in synchronism with the terminal of the rate-determining shaft, the other shafts when a plurality of shafts are moved, and the auto-acceleration method controls the acceleration and deceleration value when the range of motion is small.

Figure 4:
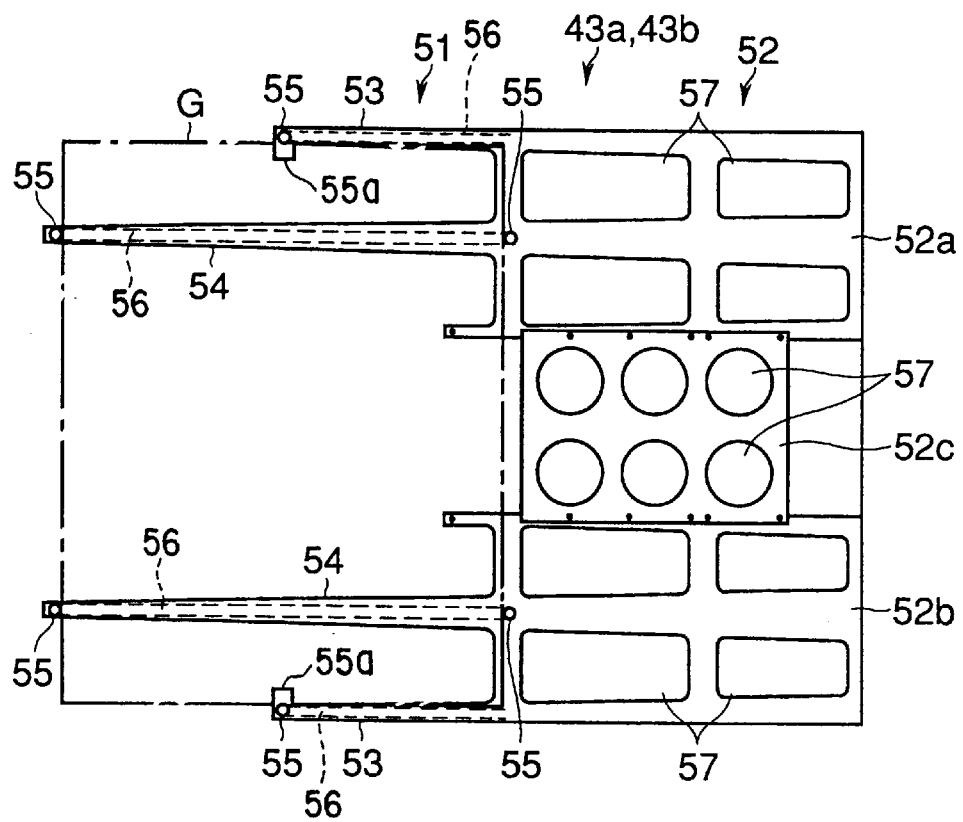
FIG. 4 is a plane view showing a substrate support members of the main transferring machine.

The substrate support members 43a and 43b have substantially the same structure, and as shown in FIG. 4, each of the substrate support members 43a and 43b has a forward portion 51 on which a substrate is actually loaded and a base portion 52 integrally connected thereto. The forward portion 51 has a pair of outer support segments 53 and a pair of inner support segments 54 which are extended from the base portion 52 and are slim, for supporting an outer periphery of a substrate G. The inner support segments 54 are longer than the outer support segments 53, tapered and placed at an inner position than the support segments 53. Preferably, the inner support segments 54 each may have a length substantially equal to the width of the rectangular substrate G, as shown by short dash-long dash lines in FIG. 4, while the outer support segments 53 each may have a length substantially half the width thereof. The tip end of each of the outer support segments 53 has a support piece 55a for supporting the outer periphery of the substrate G.

Figure 5:
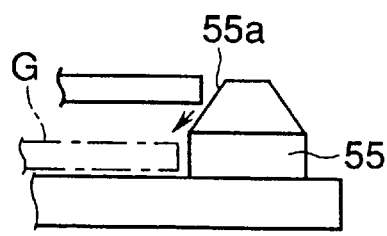
FIG. 5 is a view explaining a method of holding the substrate to the substrate support members by use of a guide member.
Figure 6:
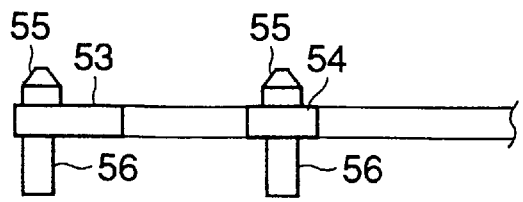
FIG. 6 is a view showing reinforcing ribs for outer and inner support segments of support members.

Six guide elements 55 are provided in the forward and base portions 51 and 52. In other words, one guide element 55 is provided on the upper surface of the tip of each of the outer support segments 53. Similarly, one guide element 55 is provided on the upper surface of the tip of each of the inner support segments 54. Two guide elements are provided on the upper surface of the base portion 52 which is adjacent to the forward portion 51. Then, the guide elements 55 of the outer support segments 53 are placed opposite to each other to sandwich a pair of short sides of the substrate G at, for example, the center thereof. Also, two guide elements 55 of the inner support segments 54 are placed opposite to the two guide elements 55 of the base portion 52 to sandwich a pair of long sides of the substrate G together therewith. In other words, the six guide elements 55 are arranged to hold the outer periphery of the substrate G. The edge of the substrate G is guided by an inclined upper part 55a of the guide element 55 to slide down and positioned by the guide element 55, as shown in FIG. 5. Also, as shown in FIG. 6, reinforcing ribs 56 are formed on the lower surface of each of the outer and inner support segments 53 and 54 throughout its length.

The substrate support members 43a and 43b have the structure in which portions 52a and 52b are connected by a portion 52c, and holes 57 for lightening are formed on these portions in the base portion 52.

Figure 7:
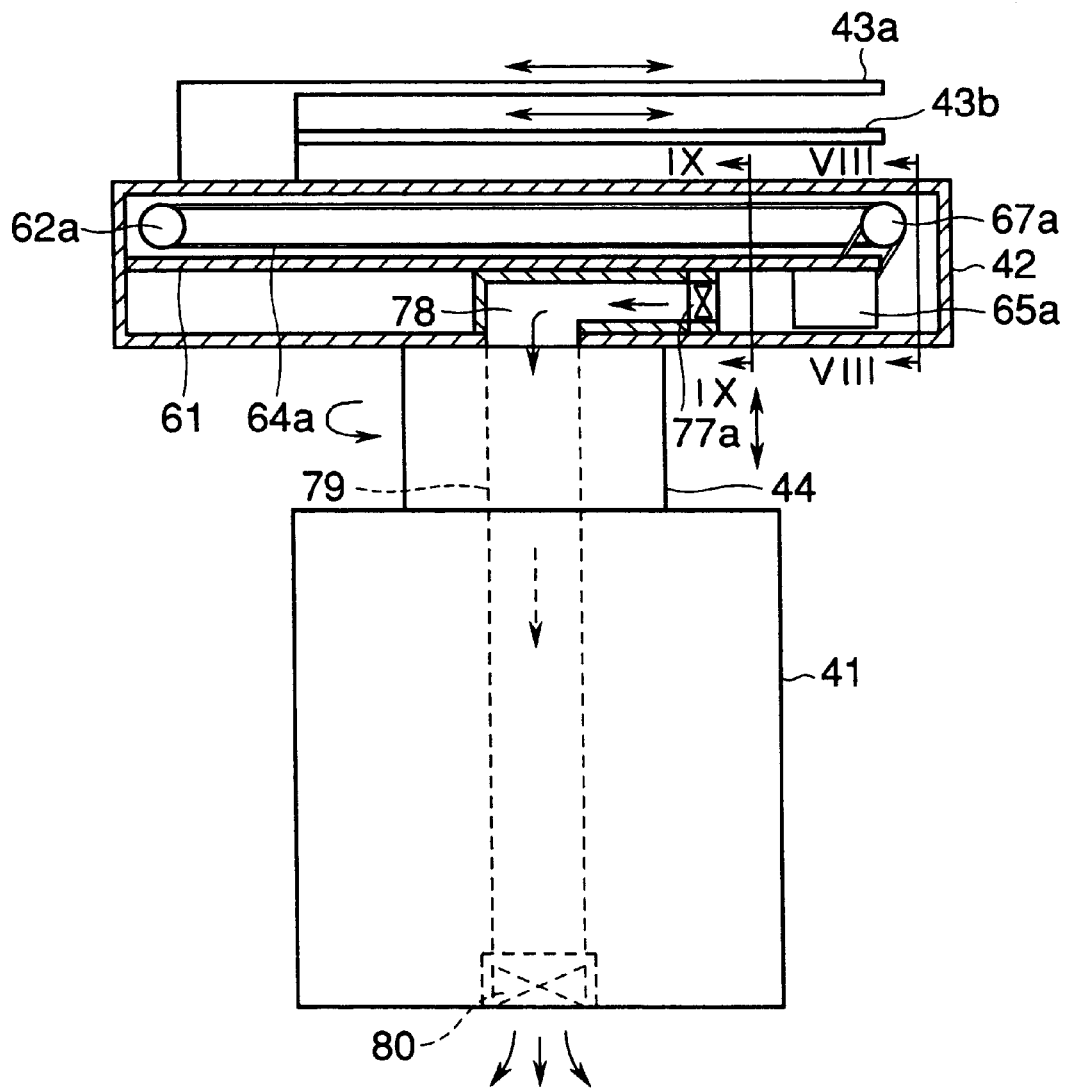
FIG. 7 is a partially sectional side view showing a driving mechanism of the substrate support members of the main transferring machine and an exhausting mechanism.
Figure 8:
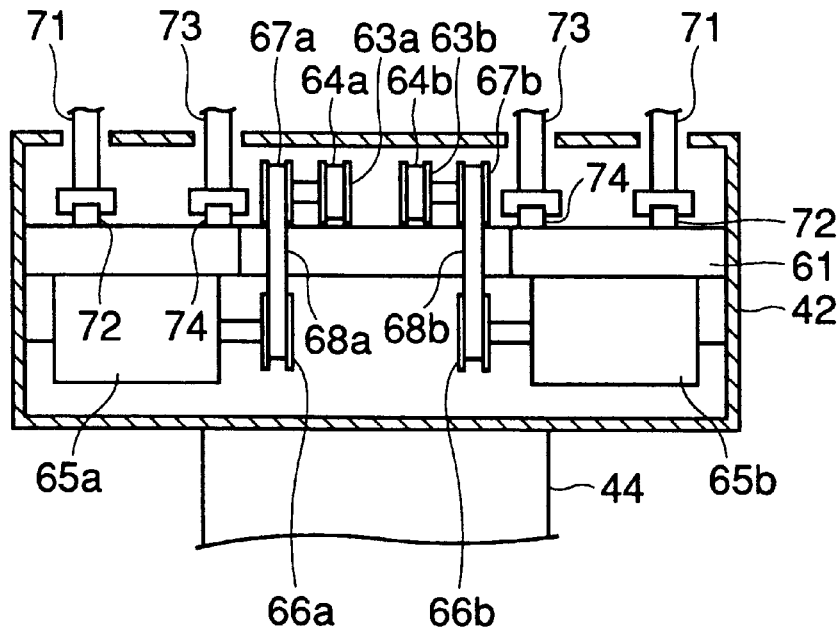
FIG. 8 is a sectional view taken along a line VIII—VIII of FIG. 7.
Figure 9:
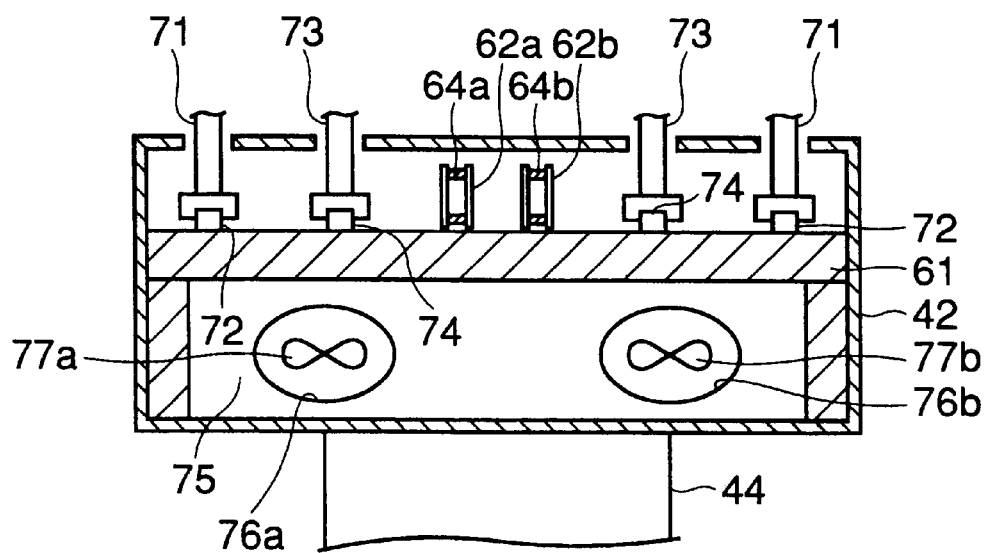
FIG. 9 is a sectional view taken along a line IX—IX of FIG. 7.

Next, the following will explain the driving mechanism and the exhausting mechanism of the substrate support members 43a and 43b in the base member 42 with reference to FIGS. 7 to 9. FIG. 7 is a partially sectional side view showing the driving mechanism of the substrate support members of the main transferring machine and the exhausting mechanism, FIG. 8 is a sectional view taken along a line VIII—VIII of FIG. 7. Also, FIG. 9 is a sectional view taken along a line IX—IX of FIG. 7.

In the base member 42, a base plate 61 is horizontally extended, and two motors 65a and 65b are attached to the lower surface of the base plate 61 on the tip side of the forward portion of the substrate support members 43a and 43b (FIG. 8). Pulleys 66a and 66b are attached to the rotation shafts of the motors 65a and 65b, respectively, and belts 68a and 68b are wound around these pulleys, respectively. Pulleys 63a and 63b are fixed to the pulleys 67a and 67b at their insides in parallel, respectively. On the other hand, pulleys 62a and 62b are provided at the end portion of the base plate 61 on the side opposite to the pulleys 63a and 63b in correspondence therewith, respectively. A belt 64a is wound around the pulleys 63a and 62a, and a belt 64b is wound around the pulleys 63b and 62b. The rotations of the motors 65a and 65b are transmitted to the pulleys 63a and 63b through the pulleys 66a and 66b, the belts 68a and 68b, and the pulleys 67a and 67b, so that the belts 64a and 64b are driven. On the base plate 61, there are provided a pair of rails 72 at both outer portions and a pair of rails 74 at the inside along the direction where the substrate support members 43a and 43b are moved. Guide members 71 run on the rails 72, and guide members 73 run on the rails 74. The guide members 71 overhangs the lower substrate support member 43b, so that the guide members 71 are connected to the upper substrate support member 43a, and further connected to the belt 64a by a connecting member (not shown). The guide members 73 are connected to the lower substrate support member 43b, and further connected to the belt 64b by a connecting member (not shown). Therefore, when the motor 65a is driven, the upper substrate support member 43a is moved, and when the motor 65b is driven, the lower substrate support member 43b is moved.

On the other hand, as shown in FIG. 9, a shielding plate 75 is provided on a portion closer to the central portion in the vicinity of the motor arrangement portion of the base plate 61. The shielding plate 75 is placed in a direction perpendicular to the direction in which the substrate support members 43a and 43b are moved, so that a motor arrangement portion and the central portion are separated from each other by the shielding plate 75 in the lower space of the base plate. Holes 76a and 76b are formed on the shielding plate 75 at positions corresponding to the portions to which the rotation shafts of the motors 65a and 65b are projected, respectively. Exhaust fans 77a and 77b are provided on the shielding plate 75, to exhaust the motor arrangement portion of the base member 42. The exhaust fans 77a and 77b are connected to a flat exhaust path 78 horizontally extending to the center. The exhaust path 78 is continuous to an exhaust path 79, which extends perpendicularly through the center of the coupling member 44 coupled to the central portion of the base member 42 and the center of the main body 41. An exhaust fan 80 is provided on the bottom of the main body 41, to exhaust the interior of the base member 42 downward through the exhaust path 79.

On the bottoms of the transferring paths 12 and 13 on which the main body 41 moves is provided a member having opening portions formed by grating in place of a conventional member having opening portions formed by punching. In this case, a numerical aperture is increased to 70% as compared with the conventional case of 45%.

The above-structured main transferring machine 17 is adjusted to a predetermined position in such a manner that the base member 42 is moved up and down and rotated while the main body 41 is moving on the transferring path 12. By the base support members 43a and 43b, the substrate G is exchanged between an arm 11 of a transferring mechanism 10 and the main transferring machine 17. Also, the substrate G is exchanged between the respective units of a front stage section 2a. Moreover, the substrate G is exchanged between a relay unit 15 and the main transferring machine 17. Similarly, the main transferring machine 18 is adjusted to a predetermined position in such a manner that the base member 42 is moved up and down and rotated while the main body 41 is moving on the transferring path 12. By the base support members 43a and 43b, the substrate G is exchanged between the relay unit 15 and the main transferring machine 18. Also, the substrate G is exchanged between the respective units of a middle stage section 2b. Moreover, the substrate G is exchanged between a relay unit 16 and the main transferring machine 18. Similarly, the main transferring machine 19 is adjusted to a predetermined position in such a manner that the base member 42 is moved up and down and rotated while the main body 41 is moving on the transferring path 13. By the base support members 43a and 43b, the substrate G is exchanged between the relay unit 16 and the main transferring machine 19. Also, the substrate G is exchanged between the respective units of a rear stage section 2c. Moreover, the substrate G is exchanged between an interface section 3 and the main transferring machine 19.

In this case, the substrate support members 43a and 43b have the pair of outer support segments 53 for supporting the outer periphery of the substrate G, and the pair of inner support segments 54 for supporting its inside. Due to this, even if the size of the substrate G is large, its deflection can be reduced. Therefore, there are not caused the disadvantages such as the increase in the strokes of the up and down motion in transferring the substrate G and the transfer error because of the deflection of the substrate.

The conventional method for supporting only the outer periphery of the substrate generates deflection of 20 mm and more at the central portion of the substrate such as LCD glass substrate of 830×650 mm, when it is supported by the conventional support members. In contrast, since, in the present invention, the pair of the inner support segments 54 is formed at 120 mm inner side of the outer support segments, deflection can be greatly reduced to about 5 mm.

The outer support segments 53 are structured to be shorter than the inner support segments 54, and the guide elements 55 provided at the tips of the outer support segments 53 are formed to sandwich the pair of short sides of the substrate G.

Two guide elements 55 of the inner support segments 54 are provided to sandwich the pair of long sides of the substrate G together with the corresponding two guide elements 55 of the base portion 52. Six guide elements 55 are formed to hold the outer periphery of the substrate G. As a result, even if the size of the substrate G is large, the substrate G can be surely held.

Since the outer and inner support segments 54 of the substrate support members 43a and 43b have reinforcing ribs on their lower surfaces, so that they can reinforce the substrate support members 43a and 43b without preventing the transfer of the substrate. Such reinforcing ribs are useful to the case when the size of the substrate G is enlarged. Also, since the substrate support members 43a and 43b are lightened by the formation of numerous holes 57 on the base portion 52 of these members 43a and 43b, their operation controllability is high, and this is particularly useful to the case when the large-sized substrate is transferred.

Moreover, the interior of the base member 42 is exhausted to the lower side of the main body 41 through an exhaust path 59 which is provided in the coupling portion 44 coupled to the central portion of the base member 42 from the portion close to the motors 65a and 65b of the base member 42. As a result, an exhaust efficiency is obtained which is higher than the conventional case in which the exhaust is performed from the side portion separated from the drive section of the base member. Also, the particles generated from the motors can be effectively removed, and the particles can be prevented from being scattered to the outside of the cover. The exhaust is performed by the exhaust fans 77a and 77b, which are provided close to the motors 65a and 65b, and an exhaust fan 80, which is provided on the exhaust path 59 of the main body 41. As a result, the exhaust efficiency and the prevention of particle scattering can be extremely improved, so that the particles generated by the driving mechanism such as motors can be surely removed.

On the bottoms of the transferring paths 12 and 13 is provided the member having opening portions formed by grating in place of the conventional member having the opening portions formed by punching. As a result, the numerical aperture is increased to 70% as compared with the conventional case of 45%, and controllability of an air current is increased, so that the splashes of the particles can be effectively prevented.

Figure 10:
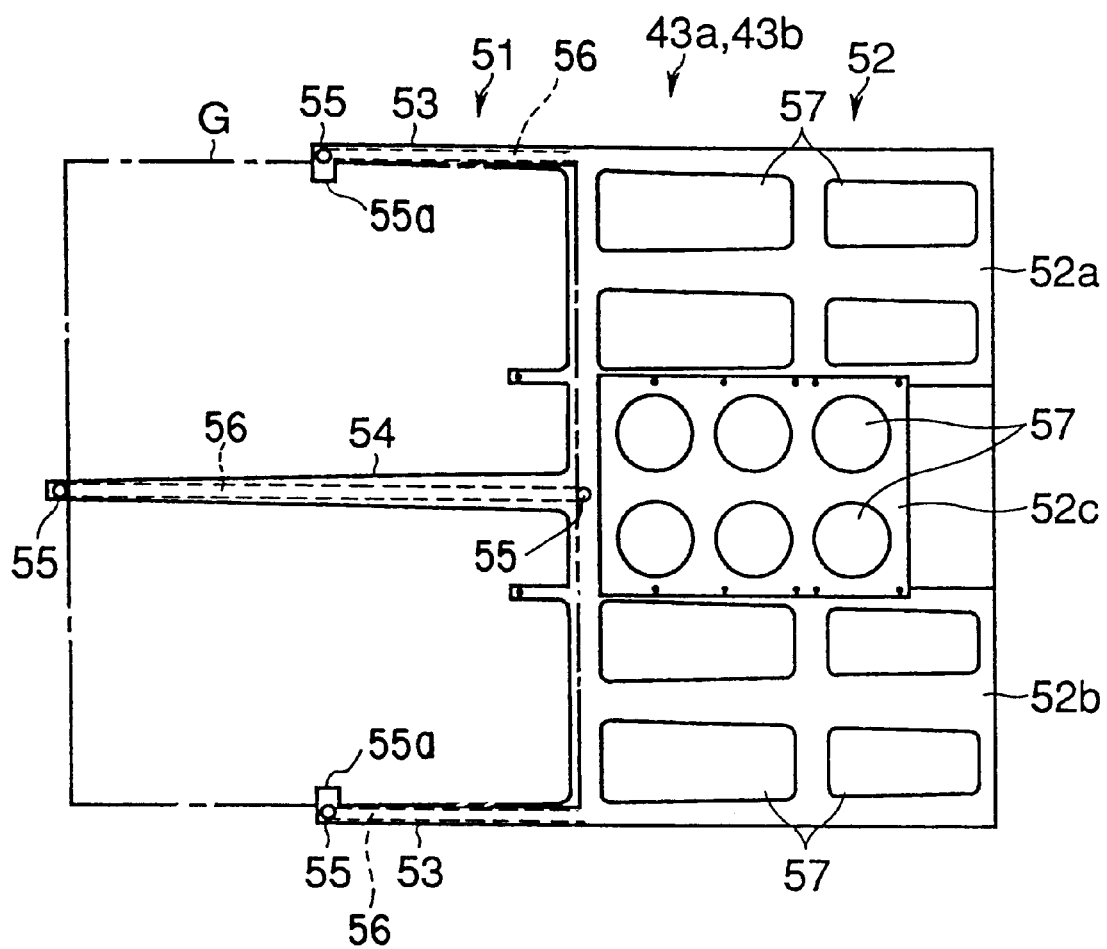
FIG. 10 is a plane view showing a substrate support members of the main transferring machine according to another embodiment.

The present invention is not limited to the above-mentioned embodiment and various modifications can be made. For example, the above embodiment explained the case in which the present invention was applied to the main transferring machine. However, the present invention is not limited to such a case. Also, the number of inner support segments of the substrate support member is not always two as in the above embodiment. One inner support segment may be provided as shown in FIG. 10. In other words, an inner support segment 54 extends from the center of the base portion 52. The substrate G is supported by two outer support segments 53 and one inner support segment 54. However, two inner support segments are provided as in the above embodiment and the distance therebetween is sufficiently made. Thereby, similar to the conventional case, there is an advantage in which the substrate can be transferred even in a state that the member is placed therebetween.

The above embodiment explained the example in which the present invention was applied to the resist coating/developing unit. However, the present invention may be applied to the other processes without limiting to such a case. Also, the above embodiment explained the case in which the LCD substrate was used. However, it is needles to say that the present invention may be applied to the processes of the other substrates without limiting to such a case.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A substrate transferring apparatus for transferring a rectangular substrate while moving on a transferring path, comprising:

support members for supporting the rectangular substrate, said support members each having a pair of outer support segments for supporting opposite side edges of the rectangular substrate, respectively, and at least one inner support segment provided between said outer support segments;

a base member for supporting the support members movably;

a driving mechanism, provided in said base member, for moving said support members;

a main body supporting said base member, and moving on said transferring path;

an exhausting path extending downward through said main body from a portion close to said driving mechanism; and exhausting means for exhausting an interior of said base member through said exhausting path.

2. The substrate transferring apparatus according to claim 1, further comprising a coupling member for coupling the center of said base member to said main body, and for supporting said base member to be rotatable and movable up and down.

3. The substrate transferring apparatus according to claim 1, wherein said base member has an exhausting path and said coupling member has an exhausting path provided at its center to be continuous to the exhausting path of said base member and the exhausting path of said main body.

4. The substrate transferring apparatus according to claim 1, wherein said exhausting means includes a first exhausting fan provided close to said driving mechanism and a second exhausting fan provided on a side of said main body.

5. The substrate transferring apparatus according to claim 1, wherein said outer support segments and said inner support segment each have a lower surface provided with a reinforcing rib.

6. The substrate transferring apparatus according to claim 1, wherein said support members have two inner support segments.

7. The substrate transferring apparatus according to claim 1, wherein said support members have a base portion from which said outer support segments and said inner support segment are extended, said base portion has holes.

8. The substrate transferring apparatus according to claim 1, wherein said exhausting means includes an exhausting fan provided close to said driving mechanism.

9. The substrate transferring apparatus according to claim 1, wherein said exhausting means includes an exhausting fan provided on a side of said main body.

10. A substrate processing apparatus for subjecting a predetermined process to a rectangular substrate, comprising:

a processing section for providing the predetermined process to the rectangular substrate; and a substrate transferring machine for transferring the rectangular substrate while moving on a transferring path in said processing section, said substrate transferring apparatus comprising:

support members for supporting the rectangular substrate, said support members each having a pair of outer support segments for supporting opposite side edges of the rectangular substrate and at least one inner support segment provided between said outer support segments;

a base member for supporting the support members movably;

a driving mechanism, provided in the base member, for moving said support members;

a main body supporting said base member, and moving on said transferring path;

an exhausting path for exhausting downward through said main body from a portion close to said driving mechanism; and exhausting means for exhausting an interior of said base member through said exhausting path.

11. The substrate processing apparatus according to claim 10, wherein said substrate transferring machine further comprises a coupling member for coupling the center of said base member to said main body, and for supporting said base member to be rotatable and movable up and down, said base member has an exhausting path.

12. The substrate processing apparatus according to claim 11, wherein said coupling member has an exhausting path provided at its center to be continuous to the exhausting path of said base member and the exhausting path of said apparatus main body.

13. The substrate processing apparatus according to claim 10, wherein said exhausting means a first exhausting fan provided close to said driving mechanism and a second exhausting fan provided on said apparatus main body side.

14. The substrate processing apparatus according to claim 10, wherein said exhausting means includes an exhausting fan provided close to said driving mechanism.

15. The substrate processing apparatus according to claim 10, wherein said exhausting means includes an exhausting fan provided on said apparatus main body side.

16. A substrate transferring apparatus comprising:

a base member moving up and down and having a base plate;

support members mounted on said base member for supporting a rectangular substrate, said support members each having a pair of outer support segments for supporting opposite side edges of the rectangular substrate, respectively, and at least one inner support segment provided between said outer support segments;

a drive unit provided in said base member for moving said support members to transfer the substrate, said drive means having motors attached to said base plate; and a shielding plate provided between a portion closer to a central portion of said base plate and a position at which said drive means is arranged.

* * * * *